(12) United States Patent
Fiermuga

(10) Patent No.: US 8,253,347 B2
(45) Date of Patent: Aug. 28, 2012

(54) EMERGENCY EGRESS LIGHTING SYSTEM

(75) Inventor: Robert F. Fiermuga, Glenview, IL (US)

(73) Assignee: Value Lighting, Inc., Glenview, IL (US)

( * ) Notice: Subject to any disclaimer, the term of this patent is extended or adjusted under 35 U.S.C. 154(b) by 574 days.

(21) Appl. No.: 12/508,361

(22) Filed: Jul. 23, 2009

(65) Prior Publication Data
US 2010/0020527 A1 Jan. 28, 2010

Related U.S. Application Data

(60) Provisional application No. 61/135,756, filed on Jul. 23, 2008.

(51) Int. Cl.
H05B 37/02 (2006.01)
F21V 19/04 (2006.01)

(52) U.S. Cl. ........... 315/291; 315/129; 315/160; 360/20

(58) Field of Classification Search .................. 315/291, 315/295, 307, 129, 160; 360/20
See application file for complete search history.

(56) References Cited

U.S. PATENT DOCUMENTS

| | | |
|---|---|---|
| 6,502,044 B1 | 12/2002 | Lane et al. |
| 6,909,239 B2 | 6/2005 | Gauna |
| 7,086,747 B2 | 8/2006 | Nielson et al. |
| 7,737,640 B2 | 6/2010 | Marques et al. |
| 2004/0257789 A1 | 12/2004 | Nielson et al. |
| 2005/0201078 A1 | 9/2005 | Hannington |
| 2006/0274525 A1 | 12/2006 | Nielson et al. |
| 2007/0008710 A1 | 1/2007 | Nielson et al. |
| 2007/0115662 A1 | 5/2007 | Roberts et al. |
| 2007/0211461 A1* | 9/2007 | Harwood ...................... 362/232 |
| 2007/0217209 A1 | 9/2007 | Wong |
| 2008/0198600 A1 | 8/2008 | Crandell et al. |
| 2010/0061090 A1 | 3/2010 | Bergman et al. |
| 2011/0309747 A1* | 12/2011 | Michaud et al. ................ 315/86 |
| 2012/0098439 A1* | 4/2012 | Recker et al. ................. 315/152 |

FOREIGN PATENT DOCUMENTS

| | | |
|---|---|---|
| JP | 10-021715 A | 1/1998 |
| KR | 10-2007-0001183 A | 1/2007 |
| KR | 10-2008-0036195 A | 4/2008 |

OTHER PUBLICATIONS

Hubbell Lighting, Inc., "Dual-Lite PG Series, High Performance LED Emergency Lighting" Brochure, May 2009 (12 pages).
Hubbell Lighting, Inc., "Dual-Lite, PG Indoor/Outdoor Emergency Lighting Unit," Specification Sheet, May 2009 (2 pages).
www.flexrad.com, FlexRAD™, web pages available before Jul. 22, 2008 (3 pages).

* cited by examiner

Primary Examiner — Don Le
(74) Attorney, Agent, or Firm — Pauley Petersen & Erickson

(57) ABSTRACT

An egress lighting system which utilizes an efficient primary and emergency light source and complies with the NEC standards for emergency egress lighting. This invention combines two sets of LEDs onto a single circuit board to provide primary lighting and secondary emergency egress lighting while keeping the circuits of the primary and secondary lighting electrically separate or isolated.

20 Claims, 4 Drawing Sheets

EMERGENCY EGRESS LIGHTING SYSTEM

CROSS REFERENCE TO RELATED APPLICATION

This application claims the benefit of U.S. Provisional Patent Application, Ser. No. 61/135,756, filed on 23 Jul. 2008. The co-pending provisional patent application is hereby incorporated by reference herein in its entirety and is made a part hereof, including but not limited to those portions which specifically appear hereinafter.

BACKGROUND OF THE INVENTION

1. Field of the Invention

This invention is directed to a solid-state lighting device, such as light emitting diode (LED) device, for illumination as a primary light source as well as for emergency or security situations.

2. Discussion of Related Art

The National Electric Code (NEC) mandates that commercial buildings provide emergency egress lighting in case of power failures. As such, various primary and secondary light source systems have been developed for the entryways of public buildings. In general, these systems have a primary light source which is powered off the electrical grid and provides ample luminance for normal operation. A secondary emergency light source can provide at least a minimum luminance for an extended duration, as established by the NEC standard, until the primary light source is working.

In these dual purpose egress lighting systems, the primary light source needs to provide specified lighting parameters, while the secondary light source needs to provide a minimum level of lighting for an extended duration. Known dual purpose systems use an incandescent or other type of bulb, which provides ample lighting, in combination with an LED, which can provide a minimum level of light for extended periods while drawing minimum amount of power. Such a system is disclosed in U.S. Pat. No. 6,909,239, the entire teachings of which are incorporated into and made a part of this specification by reference to U.S. Pat. No. 6,909,239. However, the incandescent bulbs of such systems are inefficient because they draw significant power and require maintenance to replace the incandescent bulb when it burns out.

There is a continuing need for an improved lighting system which utilizes an efficient light source, such as LEDs, with the dual purpose of providing both a primary lighting source as well as an emergency lighting source and for such a system to comply with NEC standards for emergency egress lighting.

SUMMARY OF THE INVENTION

This invention relates to an improved primary and emergency lighting system which utilizes a solid state light source, such as LEDs, and complies with NEC standards for emergency egress lighting. The invention includes a lighting device with two sets of LEDs on a single circuit board in order to provide bi-level or multi-level combined primary and secondary emergency egress lighting, while keeping the circuits of the primary and secondary lighting electrically separate or isolated.

The invention includes a solid state lighting device having a circuit board. A primary light source and a secondary light source are provided, with each including an LED electrically connected to the circuit board. The lighting device further includes a primary electrical connection for connecting a primary power source with the primary light source through the circuit board, and a secondary electrical connection for connecting a secondary power source with the secondary light source through the circuit board.

The invention further includes a solid state lighting device with a circuit board including a primary circuit and a secondary circuit, where the primary circuit is electrically separate from the secondary circuit. The primary circuit includes a primary electrical connection for connecting a primary power source with the primary circuit. The secondary circuit includes a secondary electrical connection for connecting a secondary power source with the secondary circuit. The lighting device includes a primary light source with a plurality of LEDs electrically connected to the primary circuit, and a secondary light source including at least one LED electrically connected to the secondary circuit. The secondary light source has a light output that can be equal to, but is desirably less than a light output of the primary light source and is powered by the secondary power source upon the interruption of the primary power source, thereby allowing the secondary light source to function as an emergency backup light source.

It is a further object of this invention to provide a divisible or separable circuit board with a frangible line of separation allowing for separation of the primary light source from the secondary light source.

Other objects and advantages will be apparent to those skilled in the art from the following detailed description taken in conjunction with the appended claims and drawings.

DETAILED DESCRIPTION OF THE INVENTION

The present invention provides a primary and emergency lighting system which utilizes a solid state light source, such as LEDs, and complies with NEC standards for emergency egress lighting. The invention includes a primary and an emergency egress lighting on a single circuit board for use in manufacturing new lighting devices or retrofitting existing lighting devices.

Figure 1:
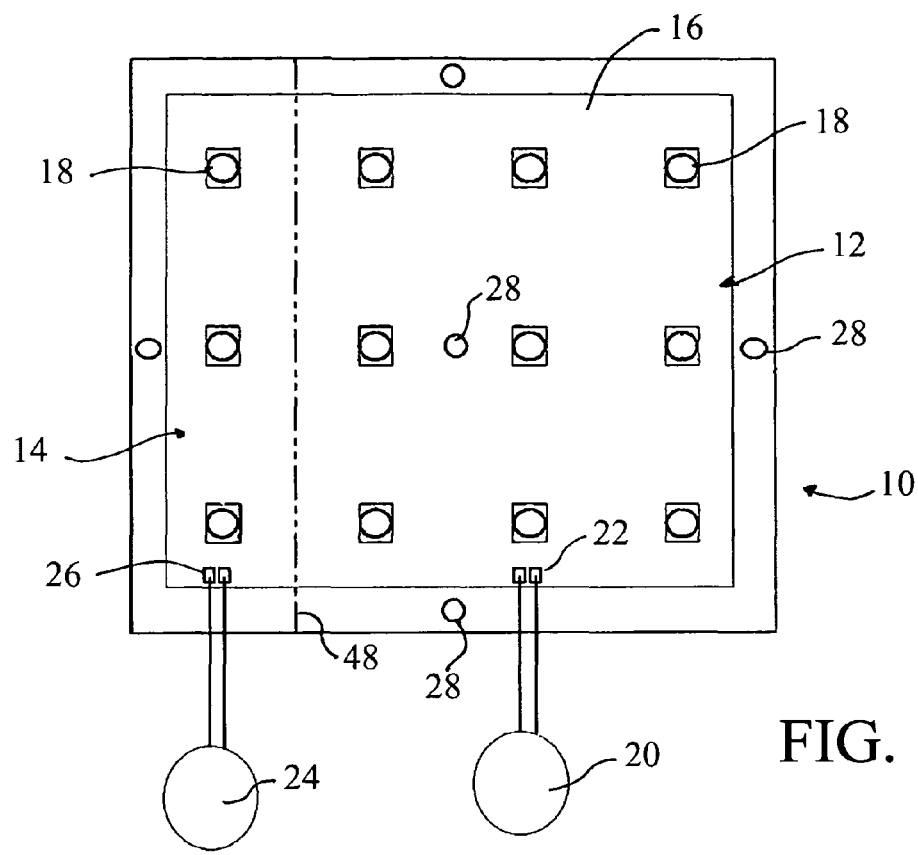
FIG. 1 is a top view of a lighting device according to one embodiment of this invention.

FIG. 1 is a schematic of a lighting device 10 having both a primary lighting functionality and an emergency egress functionality, according to one embodiment of this invention. The lighting device 10 includes a primary light source 12 and a secondary light source 14 which are both wired to a circuit board 16. The primary light source 12 and the secondary light source 14 each include at least one and desirably a plurality of light emitting diodes (LED) 18.

The primary light source 12 is in electrical connection with the circuit board 16. As used herein, the term "electrical connection" or "electrically connected" refers to a connection between elements that allows electrical power to pass from one element to the other. The primary light source 12 is provided as a light source for use alone or in combination with other lighting devices to provide adequate light to allow the normal desired activity in an area. The primary light source 12 is includes a primary electrical connection 22 for connecting the primary light source 12 to a primary power source 20. The primary electrical connection 22 can be any suitable connection that allows the transfer of electrical power from the primary power source 20 to the circuit board 16 and ultimately to the LEDs 18 of the primary light source 12. In one embodiment of this invention the primary electrical connection 22 includes a surface to which wiring connected to the primary power source 20 can be soldered to the circuit board 16. However, various other electrical connectors known to those skilled in the art of electrical wiring and circuits can be used as well.

The primary power source 20 is desirably a steady source of power that provides consistent power for serving as at least a portion of the primary lighting of an area for normal operations. In one embodiment, the primary power source 20 is an alternating current power source such as an electrical grid. However, the primary power supply 20 may be any power supply that can provide sufficient power, including but not limited to a battery and/or a generator. The electrical connection between the primary power supply 20 and the primary light source 12 can include resistors and other components as needed, based upon the electrical characteristics of the primary power supply 20 and the electrical characteristics of the primary light source 12.

The secondary light source 14 is also in electrical connection with the circuit board 16. The secondary light source 14 is provided as a secondary light source, for use alone or in combination with the primary light source 12. In one embodiment of this invention, the secondary light source 14 has a light output or power rating that is less than the primary light source, and the secondary light source 14 serves as emergency or safety lighting. For example, current UL924 standards and typical building code standards require low voltage Class II wiring, usually 12 to 24 volt for emergency lighting, and Class I wiring, usually 120 to 277 volt for primary lighting. The secondary power source 24 powers the secondary light source 14 upon the interruption of the primary power source 12. The interruption of the primary power source 20 can be, for example, a power outage or simply a customary manual shutdown of the primary light source 12, such as at the end of a work day in an office building. By remaining on when the electrical current to the primary light source 12 is interrupted, the secondary light source 14 provides enough light to allow for emergency or safe movement. In some embodiments of this invention, the switching between the two light sources 12 and 14 is performed by components external to the circuit board 16.

The secondary light source 14 includes a primary electrical connection 26 for connecting the secondary light source 14 to a secondary power source 24. The secondary electrical connection 26 can be any suitable connection, such as discussed above. In one embodiment of this invention, the secondary power supply 24 is a backup power supply to the primary power supply 20. The secondary power supply 24 is preferably but not necessarily an electrical generator. The secondary power supply 24 may be any power supply able to provide sufficient power including a battery, a battery and generator combination, the electrical grid and/or another suitable power source or power supply. The secondary power supply can be local, such as a battery contained in a particular lighting device housing or fixture, or regional, such as a battery and/or generator for multiple emergency lights in a structure or area. The electrical connection between the secondary power supply 24 and the secondary light source 14 may include resistors and other components as needed, based upon the electrical characteristics of the secondary power supply 24 and the electrical characteristics of the secondary light source 14.

In some embodiments of this invention, the primary light source 12 and the primary power supply 20 are electrically separate or isolated from each other so that electricity cannot flow from one of the circuits to the other. The circuit board 16 includes two circuits. A primary circuit connects the electrical connectors 22 to the LEDs 18 of the primary light source 12, and a secondary circuit connects the electrical connectors 26 to the LEDs 18 of the secondary light source 14. In some embodiments of this invention, the separate secondary light source 14 can also be powered by the primary power source 20, thereby allowing the lighting device to have the combined output of the two light sources 12 and 14.

Figure 8:
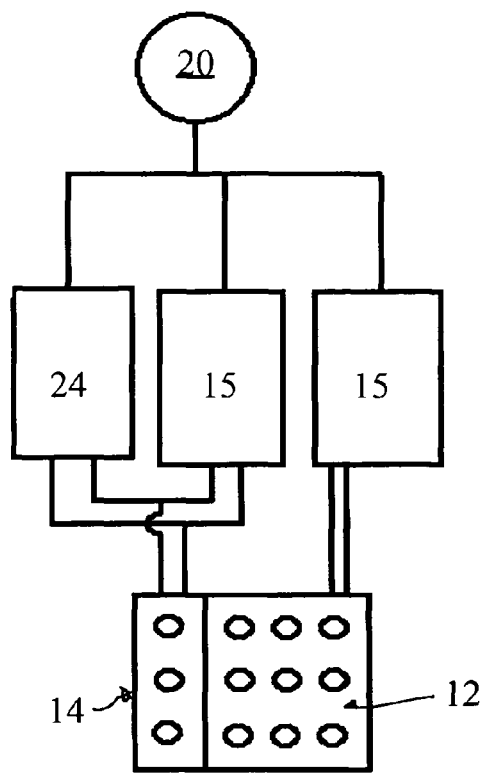
FIGS. 8 and 9 show general schematics of exemplary wiring diagrams according to alternative embodiments of this invention.
Figure 9:
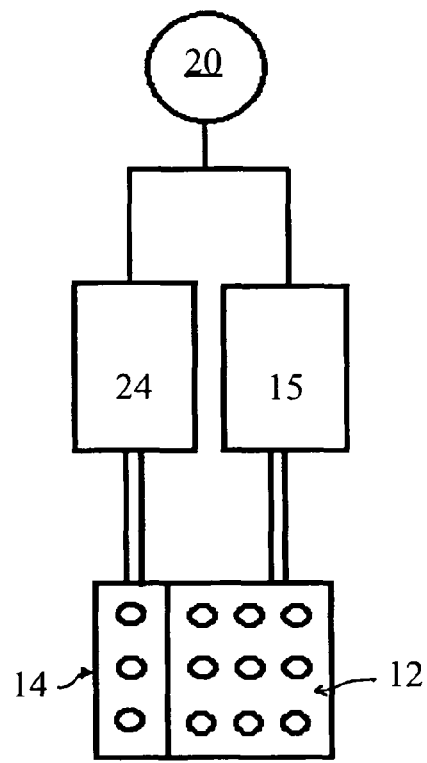

FIG. 8 shows a general schematic of a wiring diagram where the primary and secondary light sources 12 and 14 are both on, and thus combined, while the primary power source 20 is not interrupted. Each of the primary and secondary light sources 12 and 14 is coupled to the primary power source 20 through a respective LED driver 15. The secondary light source 14 is powered by the primary power source 20 unless electricity from the primary power source 20 is interrupted. The secondary power source 24, shown as an emergency backup battery pack, is also connected to the primary power source 20 to allow for recharging. Upon interruption, the battery pack 24 provides DC power to only the secondary light source 14. FIG. 9 illustrates an alternative schematic, where the secondary light source 14 is only illuminated upon interruption of the primary light source 12. The battery pack 24 can include a sensing module for sensing a power interruption, i.e., loss of AC current, and then switching on or otherwise providing DC power from the battery pack 24 to the secondary light source 14. The battery 24 is still connected to the AC power source 20 for charging, but the electricity of the AC power source 20 does not directly pass to the secondary light source 14. As will be appreciated, these wiring schematics are intended to be general and not limiting, as other wiring configurations can be used to provide the emergency lighting device of this invention.

In one embodiment of this invention, the lighting device 10 can be combined with a second similar lighting device or other emergency egress lighting device, such that the combination provides sufficient luminance to comply with the emergency egress lighting requirements, such as required by NEC or other standards.

Figure 2:
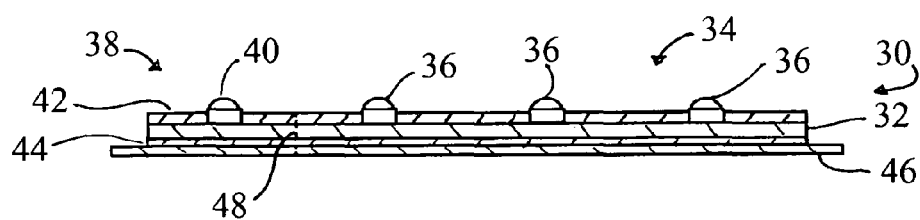
FIG. 2 is a sectional side view of a lighting device according to another embodiment of this invention.

FIG. 2 shows a sectional view, not to scale, of a lighting device 30 according to one embodiment of this invention. The lighting device includes a circuit board 32, a primary light source 34 including LEDs 36 electrically connected to the circuit board 32, and a secondary light source 38 including LEDs 40 also electrically connected to the circuit board 32. The LEDs 40 are less in number and/or combined total wattage than the LEDs 36, thereby providing the secondary light source 38 with a light output less than the primary light source 34. As will be appreciated, the amount of LEDs and/or light output of the two light sources can be the same if desired, but as discussed above, current emergency lighting standards typically, if not always, require a lower voltage or output for emergency lighting.

In some embodiments of this invention, the circuit board 32 includes or is formed as a flexible circuit. Various types of flexible circuits are available for use as circuit 32, such as single sided flex circuits, dual access flex circuits, double sided flex circuits, or multi-layer flex circuits. The flexible circuit includes a conductive circuit, such as a printed circuit, on a flexible substrate. The flexible substrate can be any suitable substrate, and preferably includes a sheet, film, or fabric made from or including a metal or plastic such as, without limitation, polyimide, polyester, polyethylene napthalate, or combinations thereof. The conductive circuit can be formed including any suitable known circuit material, such as copper or silver, and applied by any known application process, such as printing or lamination. One such suitable flexible circuit is made by Metrospec Technology, LLC (Mendota Heights, Minn.) under the trade name FlexRAD.

The lighting device 30 shown in FIG. 2 includes a circuit coating 42 over the printed circuit 32. The coating 42 can be used to provide a protection layer over the circuit. Films and solder masks are exemplary protective circuit coatings for use in this invention. A solder mask is commonly a lacquer-like layer of polymer that provides a permanent protective coating for the circuit and prevents solder from bridging between conductors.

The lighting device 30 further includes an adhesive layer 44 coating some of or the entire back surface of the circuit substrate 32 that is opposite the protective coating 42. The adhesive coating 44 can be used to apply the lighting device 30 to a surface, such as in a light fixture or housing. The adhesive material is desirably a heat dissipating material, such as 8810 material available from 3M Corporation (St. Paul, Minn.). In embodiments where the flexible circuit includes a thin metal substrate, the adhesive material can also act to electrically isolate or insulate the flexible circuit from, for example, other components of the lighting fixture or housing into which the lighting device is installed.

In one embodiment of this invention, the flexible circuit 32 is adhered to a further, more rigid substrate for support and/or installation purposes. The rigid substrate can be for example, a heat sink for dissipating heat, a shaped board for use in installation, or a combination thereof. In FIG. 2, the rigid substrate 46 has a shape adapted to be installed in a fixture or housing. The rigid substrate 46 illustrated extends beyond one or more sides of the flexible circuit 32, which can be useful for including mounting holes, such as mounting holes 28 shown in FIG. 1.

In one embodiment of this invention, the lighting device 30 includes a frangible separation line 48 between the primary light source 34 and secondary light source 38. A similar frangible separation line 48 is also illustrated in FIG. 1. The frangible separation line 48 allows for the physical separation, if needed, of the two light sources 34 and 38. The frangible separation line 48 can be a printed line identifying where to cut the circuit board 32, or can be a line of weakness such as a score line in the circuit board 32 and/or rigid substrate 46 to assist in separation. The frangible line 48 can have a linear or non-linear arrangement of perforations in the circuit board 32 and/or rigid substrate 46.

The primary and secondary light sources of this invention can include various and alternative sizes, shapes, and configurations, depending on need. Furthermore, LEDs of various and alternative sizes, shapes, colors, and wattage/power are available for use in this invention, depending on need and/or government regulations. In some embodiments, as shown in FIG. 1, the primary light source 12 includes nine LEDs 18 and the secondary light source 14 includes three LEDs 18. In other embodiments, any number of LEDs 18 may be used for the primary light source 12 and any number of LEDs may be used for the secondary light source 14. The three LEDs 18 of the secondary light source 14 can be used, for example, to provide three watts of light, based upon a standard one-watt LED bulb. Such a combination should provide sufficient luminance to satisfy the current NEC emergency egress lighting standard. In another embodiment, any number of LEDs may be used to satisfy and/or exceed any standard or other requirement.

Figure 3:
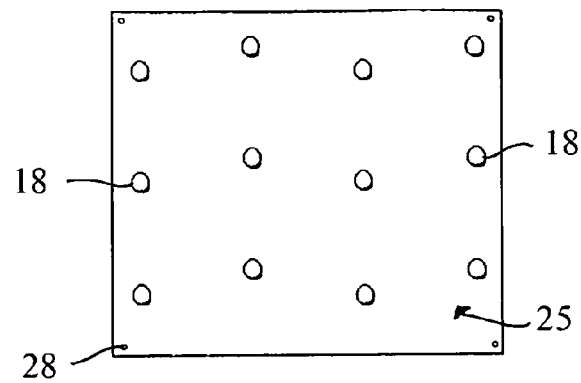
FIGS. 3-5 illustrate lighting devices having alternative LED array configurations according to additional embodiments of this invention.
Figure 4:
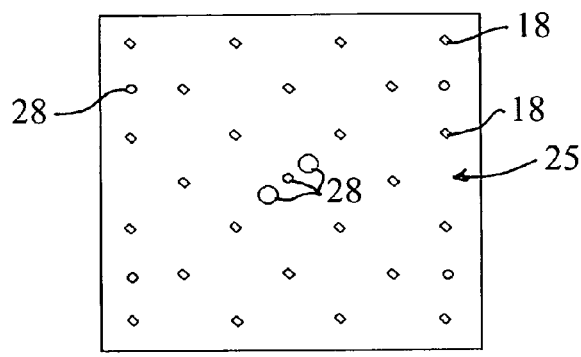
Figure 5:
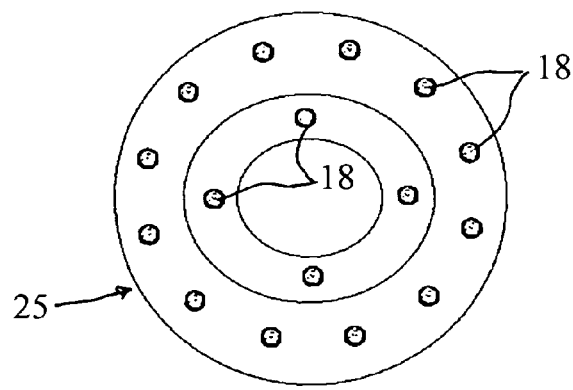

Desirably, the lighting device of this invention includes a patterned LED array. The first and second light sources can have different patterned LED arrays, but desirably each of the primary light source and secondary light source are included in or part of a single patterned LED array, such as to provide a balanced and/or aesthetically pleasing lighting device. FIGS. 1 and 2 illustrate an LED grid array, which refers to a layout of LEDs on a square or rectangular grid with a separation between adjacent LEDs of a predetermined distance in each direction. FIGS. 3-5 generally illustrate, without limitation, LEDs in other possible patterned LED arrays 25 according to this invention. Referring to FIG. 5, in one embodiment of this invention, the inner circular pattern of LEDs 18 can represent the secondary, emergency backup light source according to this invention.

Figure 6:
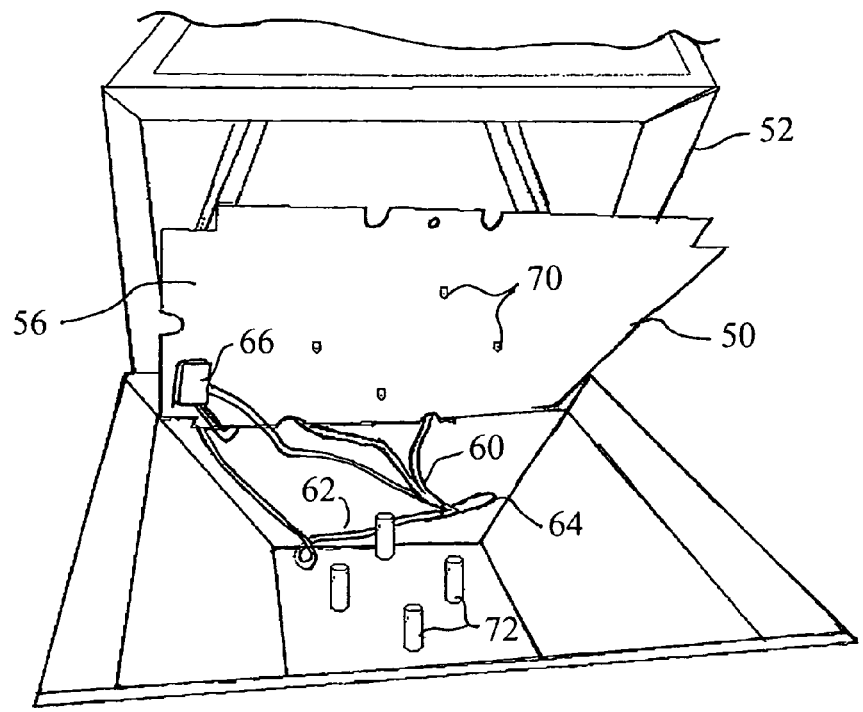
FIGS. 6 and 7 illustrate the mounting of a lighting device according to one embodiment of this invention in a light fixture.
Figure 7:
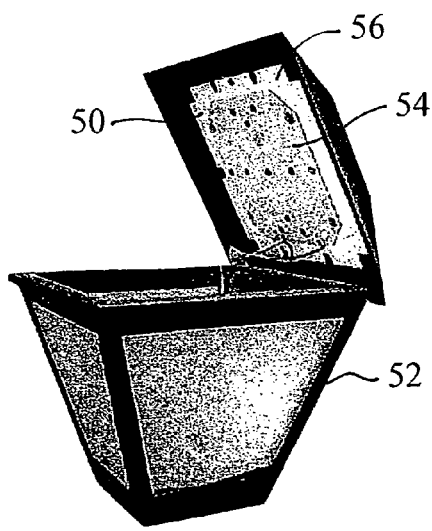

The lighting device of this invention can be used as a dual light source for newly manufactured light fixtures or for retrofitting into existing light fixtures, thereby providing an emergency egress lighting system without requiring additional fixtures. FIGS. 6 and 7 illustrate the installation of a lighting device 50 according to one embodiment of this invention into a light fixture or housing 52. As shown in FIG. 7, the circuit board 54, adhered on a rigid backing substrate 56, is sized to fit within the fixture 52. The lighting device can be manufactured to fit the fixture 52, or cut or trimmed to fit during installation.

As shown in FIG. 6, the primary light source of lighting device 50 is connected by wires 60 at connection 64 to wiring 62 of the fixture that does or will connect to an AC power source. The secondary light source of lighting device 50 can also be connected to wiring in the light fixture 52 for connecting to a backup power source, but is shown as being directly connected to battery pack 66 as the backup power source. The battery pack 66 can be optionally connected to wire connection 64 through a charging circuit that allows the battery to remain charged for use to light the secondary light source when needed.

The lighting device 50 includes four screws or bolts 70 that connect into threaded receivers 72 on the underside of the lid of the fixture 52. FIG. 7 shows the lighting device 50 of this invention mounted to the underside of the lid of fixture 52. The result is a fixture or housing that can be installed according to traditional installation methods, yet includes both a primary and emergency secondary solid state lighting source that can include light sources complying with NEC or other standards, in a single lighting device.

Thus, this invention provides an egress lighting system which utilizes an efficient primary and emergency light source and complies with the NEC standards for emergency egress lighting. This invention can combine two sets of LEDs onto a single circuit board to provide primary and emergency egress lighting while keeping the circuits of the primary and secondary lighting electrically separate or isolated with respect to each other.

The invention illustratively disclosed herein suitably may be practiced in the absence of any element, part, step, component, or ingredient which is not specifically disclosed herein.

While in the foregoing detailed description this invention has been described in relation to certain preferred embodiments thereof, and many details have been set forth for purposes of illustration, it will be apparent to those skilled in the art that the invention is susceptible to additional embodiments and that certain of the details described herein can be varied considerably without departing from the basic principles of the invention.

What is claimed is:

1. A solid state lighting device, comprising:
    a circuit board;
    a primary light source including a plurality of light emitting diodes electrically connected to the circuit board;
    a secondary light source including at least one light emitting diode electrically connected to the circuit board, the secondary light source comprising an emergency egress light source powered by the secondary power source upon the interruption of electricity from the primary power source;
    a primary electrical connection for connecting a primary power source with the primary light source through the circuit board; and
    a secondary electrical connection for connecting a secondary power source with the secondary light source through the circuit board.

2. The lighting device according to claim 1, wherein the primary power source comprises an alternating current power source.

3. The lighting device according to claim 2, wherein the secondary power source comprises a battery or a local generator.

4. The lighting device according to claim 1, further comprising a patterned LED array, wherein each of the primary light source and secondary light source are included in a pattern of the patterned LED array.

5. The lighting device according to claim 1, wherein the circuit board comprises a frangible separation line between the primary light source and secondary light source.

6. The lighting device according to claim 1, wherein the circuit board comprises a flexible circuit.

7. The lighting device according to claim 6, wherein the circuit board comprises a conductive circuit printed on a flexible metal or plastic substrate.

8. The lighting device according to claim 7, further comprising a circuit coating, the conductive circuit disposed between the substrate and the circuit coating.

9. The lighting device according to claim 6, further comprising an adhesive backing on the substrate.

10. The lighting device according to claim 6, further comprising a rigid substrate including an attachment opening for attaching the rigid substrate to a light fixture or housing, wherein the flexible substrate is adhered to the rigid substrate.

11. A method of installing the lighting device according to claim 1 in a light fixture or housing, the method comprising:
    obtaining a circuit board having a size to fit within the fixture or housing;
    connecting the primary light source to an AC power source or to wiring in the light fixture or housing for connecting to the AC power source;
    connecting the secondary light source to a backup power source or to wiring in the light fixture or housing for connecting to the backup power source; and
    fixing the circuit board to the fixture or housing.

12. A solid state lighting device, comprising:
    a circuit board including a primary circuit and a secondary circuit, the primary circuit electrically separate from the secondary circuit;
    the primary circuit including a primary electrical connection for connecting a primary power source with the primary circuit;
    the secondary circuit including a secondary electrical connection for connecting a secondary power source with the secondary circuit;
    a primary light source including a plurality of light emitting diodes electrically connected to the primary circuit; and
    a secondary light source including at least one light emitting diode electrically connected to the secondary circuit, the secondary light source having a light output less than the primary light source;
    wherein the secondary light source is powered by the secondary power source upon the interruption of electricity from the primary power source.

13. The lighting device according to claim 12, wherein the primary power source comprises an alternating current power source.

14. The lighting device according to claim 13, wherein the secondary power source comprises a battery or a local generator.

15. The lighting device according to claim 12, further comprising a patterned LED array, wherein each of the primary light source and secondary light source are included in a pattern of the patterned LED array.

16. The lighting device according to claim 12, wherein the circuit board comprises a frangible separation line between the primary light source and secondary light source.

17. The lighting device according to claim 1, wherein the circuit board comprises a flexible circuit including a conductive circuit printed on a flexible metal or plastic substrate.

18. The lighting device according to claim 17, further comprising a circuit coating, the conductive circuit disposed between the substrate and the circuit coating.

19. The lighting device according to claim 17, further comprising a rigid substrate including an attachment opening for attaching the rigid substrate to a light fixture or housing, wherein the flexible substrate is adhered to the rigid substrate.

20. A method of installing the lighting device according to claim 12 in a light fixture or housing, the method comprising:
    obtaining a circuit board having a size to fit within the fixture or housing;
    connecting the primary light source to an AC power source or to wiring in the light fixture or housing for connecting to the AC power source;
    connecting the secondary light source to a backup power source or to wiring in the light fixture or housing for connecting to the backup power source; and
    fixing the circuit board to the fixture or housing.

* * * * *